United States Patent [19]

Jeffrey et al.

[11] Patent Number: 4,931,723
[45] Date of Patent: Jun. 5, 1990

[54] AUTOMATIC TEST SYSTEM HAVING A "TRUE TESTER-PER-PIN" ARCHITECTURE

[75] Inventors: A. K. Jeffrey, Bournemouth; David J. Marsh, Ringwood; Philip I. Collins, Verwood, all of England

[73] Assignee: Schlumberger Technologies, Inc., San Jose, Calif.

[21] Appl. No.: 291,410

[22] Filed: Dec. 22, 1988

Related U.S. Application Data

[63] Continuation of Ser. No. 205,529, Jun. 9, 1988, abandoned, which is a continuation of Ser. No. 810,476, Dec. 18, 1985, abandoned.

[51] Int. Cl.⁵ .................. G01R 31/28; G01F 11/12
[52] U.S. Cl. .............................. 371/22.3; 324/158 R; 324/73.1; 371/25.1; 371/27
[58] Field of Search .......... 324/73 R, 73 AT, 158 R; 437/8; 371/15, 20, 25, 24, 27

[56] References Cited

U.S. PATENT DOCUMENTS

| | | | |
|---|---|---|---|
| 3,848,188 | 11/1974 | Ardezzonne et al. | 324/73 AT X |
| 3,873,818 | 3/1975 | Barnard | 235/153 |
| 4,125,763 | 11/1978 | Drabing et al. | 235/302 |
| 4,216,539 | 8/1980 | Raymond et al. | 371/20 |
| 4,339,819 | 7/1982 | Jacobson | 324/73 R X |
| 4,348,759 | 9/1982 | Schnurmann | 371/20 X |
| 4,439,858 | 3/1984 | Petersen | 324/73 AT X |
| 4,493,045 | 1/1985 | Hughes, Jr. | 371/27 |
| 4,598,245 | 7/1986 | Groves et al. | 324/73 R |
| 4,639,919 | 1/1987 | Chang et al. | 371/27 |
| 4,656,632 | 4/1987 | Jackson | 324/73 AT |
| 4,696,005 | 9/1987 | Millham et al. | 371/27 |

FOREIGN PATENT DOCUMENTS 0131349 1/1985 European Pat. Off.
0149048 7/1985 European Pat. Off.

OTHER PUBLICATIONS

Initial Physical Implementation . . . Electronics: Philip C. Jackson et al., Nov. 5-7, 1984: pp. 80-86.
Int'l. Test Conference 1984 Proceedings: Oct. 1984.
8032 Electronics Int'l., vol. 54 (1981) Nov. N°22, New York, U.S.
Factron Series 700, System 720 Product Description, Apr. 1985, pp. 2-9, 2-10.
Sentry Series 20 Product Description, Oct. 1081, pp. 2-10 through 2-17.
Individual Signal Path Calibration for Maximum Timing Accuracy in High Pincount VLSI Test System, Jan. 1983, 5 pages.

Primary Examiner—Reinhard J. Eisenzopf
Assistant Examiner—Vinh P. Nguyen
Attorney, Agent, or Firm—Ladas & Parry

[57] ABSTRACT

A multichannel automatic test system for an electronic circuit utilizes a "true tester-per-pin" architecture; each channel of the tester operates as if it were an independent tester. Each channel of the tester has a memory circuit which stores instructions for operating that channel of the tester. Each of these memories is cycled to the next address to provide a new instruction for that channel, only when it is necessary to change the state of operation of that channel. Thus, the timing of the events on one channel are independent of the timing on the events of any other channel in the tester. The architecture permits the use of dynamic random access memory (DRAM) circuits and allows for backward looping in the test sequence through the use of a cache memory circuit in each channel. The instructions for operating each channel of the tester are context-dependent; that is, the present state of operation of that channel of the tester is utilized in interpreting the next instruction for that channel.

19 Claims, 6 Drawing Sheets

AUTOMATIC TEST SYSTEM HAVING A "TRUE TESTER-PER-PIN" ARCHITECTURE

This is a continuation of co-pending application Ser. No. 07/205,529 filed on June 9, 1988, which is a continuation of Ser. No.: 06/810,476 filed Dec. 18, 1985, now both are abandoned.

This invention relates to a method and apparatus for the automatic testing of electronic circuits. In particular, it relates to the automatic functional testing of electronic circuits on a printed circuit board.

Functional testers are connected to the input/output connector of the printed circuit board, by means of an edge connector which mates with the circuit board when it is inserted into the fixture of the automatic testing apparatus. The functional tester exercises the board so as to simulate the actual functioning of the printed circuit board in its intended environment. The tester measures data which represent the outputs of the printed circuit board circuit, compares them against the expected result and determines whether or not the printed circuit board is functioning properly in its intended environment. Hence the name "functional tester".

FIG. 1 illustrates a prior art apparatus generally indicated as 100 for functionally testing a unit under test (UUT) 146. For clarity of illustration, the tester 100 is shown as having only three channels, whereas testers with 256 or 512 channels are common. Each pin of the tester, here labelled pins 0, 1 and n, contact the corresponding pin on the connector of the UUT. Each pin is connected in turn to the output of an interface circuit 140, 142 or 144 which contains a driver to drive the pin with predetermined signals and a receiver for receiving data from the pin. This interface circuit is known in the art as the "pin electronics". The pin electronics can drive the pin with a digital signal which is either high or low to represent a digital "1" or "0". In addition, the driver circuit can be placed in a high impedance output state and a receiver circuit can be activated to measure the data on the pin to determine whether or not the voltage on the pin is high or low thereby representing a digital "1" or a digital "0".

The pin electronics 140, 142, 144 are each connected to the output of a channel control circuit 126, 128, 130, respectively, by output buses 134, 136 and 138. The operation of the channel control circuits is directed by instructions stored in a pin control random access memory (RAM) 114, 116 or 118, there being one such memory for each channel of the tester. The test instructions stored in the pin control RAM determine if the pin is to be driven or an input of data is to be taken from the pin. In addition, it determines whether the pin is to be driven high or low or if data is to be received whether the data is expected to be high or low. The test instructions from the pin RAM also determine which of the global timing signals are utilized to produce an output or receive an input at a particular pin, as will be explained in detail below. The pin RAMs are controlled by a global sequence control processor 104 which generates an address onto address bus 112 which is coupled to all of the pin RAMs in the tester. The global sequence control processor 104 is controlled by a sequence control RAM 102 via bus 106 to implement the test program stored in sequence control RAM 102. The instructions of the program in the sequence control RAM 102 cause the global sequence control processor to generate a new address which in turn cycles all of the pin RAMs to a new address thus enabling a change in state on all of the channels of the tester. The fact that the pin RAMs function as a single memory with all RAMs cycling to the same next address at the same time allowed some prior art testers to utilize a single memory circuit in place of individual pin RAMs. The only requirement on this memory circuit is that it have a long enough word (or memory "width") to provide the required number of control bits to the input of each channel control circuit at the same time in parallel. The test program stored in sequence control RAM 102 may, for example, comprise a sequence of steps which is repeated for a given number of times. These program instructions cause the global sequence control processor to generate a sequence of addresses which implements the repetition of these steps. The address bus 112 is also coupled to the input of the sequence control RAM 102 and the input of a timing control RAM 111. The address present on this bus is utilized to fetch the next instruction from RAM 102 to control the global sequence control processor 104 and the next instruction from RAM 111 to control the operation of global timing control generator 110. The select instructions from RAM 111 are coupled to generator 110 via bus 108.

The global sequence control processor 104 operates in synchronism with a clocking signal generated by global timing control generator 110 and coupled to the global sequence control processor by line 109. The clocking signal is controlled by timing control information stored in the timing control RAM 111 to change the memory word provided to the channel control circuits 126, 128, 130 for each pin at every interval. The operation of the unit under test may dictate that all of the changes in the state of operation of the pin not occur simultaneously. The minimum amount of time between changes in the state of operation is generally limited by the cycle time of the memory in the pin RAM, which as a practical matter is too long to permit the required flexibility of activity within a cycle. Accordingly, the changes in operation are controlled by a series of timing signals produced by the global timing control generator 110 and coupled to the channel control circuits by timing signal bus 132. A typical global timing control generator may be able to produce eight sets of eight different signals each with only one of the eight sets being generated at any given time. Accordingly, timing signal bus 132 will be eight lines wide and have eight timing signals present at any given time. The selection of the particular set of timing signals that is to be generated at any given time is changeable "on the fly" under the control of the select information stored in the timing control RAM 111. The selection is made via select bus 108. Thus, the instructions contained in the pin RAMs do not merely dictate the change in state of operation of a pin but also specify the timing pulse at which the actual change in state will occur. That is, the instructions in the memory will cause the change in the state of operation of the pin to occur on a selected transition of the selected one of the eight timing pulses. For example, the timing information could go high on timing signal three, which means that the pin would be driven to a high state on the low-to-high transition of timing signal three.

Programming flexibility for the test sequences is provided by having the instructions stored in timing control RAM 111 control the set of timing pulses produced and the length of time between memory cycles. This permits maximizing the number of activities that can take place on all of the pins per memory cycle without unduly limiting the ability to change the state of any given pin.

In some prior art testers, the timing signals are generated within each channel control circuit to provide greater flexibility in performing the test sequence. However, the small number of timing signals available still places limitations on the ability of the tester to simulate the actual operating environment of the unit under test.

Functional testers employing this type of architecture have several major disadvantages. Firstly, it is desirable to have the drive/read signals correspond exactly to signals which are expected during the normal operation on the printed circuit board. The fact that there are only eight timing signals (or some other small number) available means that compromises must be made in producing signals which can be close enough to all of the desired timing functions throughout the test of the circuit. For example, if we had to perform one operation 5 nanoseconds after the clock pulse and another operation 4 nanoseconds after the clock pulse and had only a single timing signal remaining which had to be used to control both of these operations, then a compromise would have to be made. We would have to either decide which of the timing intervals was more critical to the operation of the circuit or, perhaps choose an interval of say 4.5 nanoseconds as a compromise. Even if a larger number than eight signals were provided, compromises would obviously still have to be made in programming the test. This unnecessarily complicates the generation of the test, especially for large/complex circuit boards. Because of the complexity of the implications created by the various trade off possibilities, the programming of a test for a functional tester has remained a manual task. Manually programming a precise test for a large/complex circuit can take longer and be more costly than is practical. Accordingly, compromises are usually made to reduce the effort and cost although this results in a less accurate test. This problem will be exacerbated by the increasingly complex circuit boards of the future. Increasing the number of operations that can take place between memory cycles would ease the problem but requires more bits per word and thus increases the size of the memory.

Another disadvantage of this prior art technique is that many times a pin is very active during a portion of the test and relatively quiet during the remainder of the test. However, since the memory address for all pins must be updated for a single pin-event as well as a string of pin-events, the memory locations for these relatively quiet pins must be filled with no operations (no-ops). This is extremely wasteful of expensive memory space. Furthermore, in order to improve the efficiency of programming these tests, it has been common to allow for looping of the test program. This requires the use of static random access memories (SRAMs) which are relatively expensive. In testers that do utilize the lower cost dynamic random access memories (DRAMs), portions of the program are typically periodically loaded into SRAMs for execution. A further disadvantage of this architecture is the fact that parallel address and timing buses run throughout the tester electronics because they must be connected to all electronics for all of the pins, thus creating problems of time skew between bits in these lines at higher memory speeds.

SUMMARY OF THE INVENTION

It is a general object of the present invention to provide an improved automatic test system architecture and a method for operating same.

Another object of the invention is to provide an automatic test system having a "true tester-per-pin" architecture.

A further object of the invention is to provide an automatic test system in which the pin memory is cycled to the next address only when a test instruction is required to change the state of operation of that channel.

Yet another object of the present invention is to provide an automatic test system in which the pin memory is cycled to the next address at the end of a programmed time.

A further object of the present invention is to provide an automatic test system which utilizes dynamic random access memory circuits for storing the test instructions.

Another object of the present invention is to provide an automatic test system which utilizes dynamic random access memory circuits for storing the test instructions and which permits backward loops in the sequence of test instructions.

A further object of the present invention is to provide an automatic test system in which the decoding of the test instructions to determine the next state of operation of a channel is dependent upon the present state of operation of that channel.

These and other objects, advantages and features are achieved by apparatus for testing an electronic circuit, having a plurality of tester channels. Each channel of the tester has a test pin means for contacting a test point of a unit under test; a channel control circuit means coupled to said pin for controlling the state of operation of said pin; and a pin memory circuit means for storing test instructions which direct the sequence of operation of said channel control circuit, said pin memory circuit means being controlled by said channel control circuit means to cycle said pin memory means to a next address only when a new test instruction is required for that channel.

Another aspect of the invention includes a method for operating a multichannel tester for an electronic circuit having in each channel a test pin for contacting a test point of a unit under test and a pin memory circuit for storing instructions which determine the state of operation of said test pin. The pin memory circuit is cycled to a next address only when a new test instruction is required to change a state of operation of that channel.

A further aspect of the invention includes a multichannel tester for an electronic circuit having in each channel a test pin for contacting a test point of a unit under test and a pin memory circuit for storing instructions which determine a state of operation of said test pin. A channel control circuit is coupled between said test pin and an output of said pin memory circuit. The channel control circuit includes means coupled to the output of said pin memory for decoding an instruction presented at said output; means coupled to said decoding means for controlling the state of operation of said pin in response to a control signal from said decoding means; and means coupled to said decoding means for generating the address of the next instruction in said pin memory. The address generator cycles said memory to said next address only when a new instruction is required to change the state of operation of that channel.

Another aspect of the invention comprises a multichannel tester for an electronic circuit having in each channel a test pin for contacting a test point of a unit under test and a pin memory circuit for storing test instructions which determine the state of operation of said test pin. A channel control circuit is coupled between said test pin and an output of said pin memory circuit. The channel control circuit includes a programmable timing means responsive to the output of said pin memory for timing a desired interval between a present state of operation of said test pin and a next state of operation of said pin and means coupled to said timing means for generating the address of a next instruction in said pin memory. The memory is cycled to said next address at the end of said programmed time.

A still further aspect of the invention includes a method for operating a multichannel tester for an electronic circuit having in each channel a test pin for contacting a test point of a unit under test and a pin memory circuit storing test instructions which determine the state of operation of said test pin, and a channel control circuit coupled between said test pin and an output of said pin memory circuit. A timer is programmed utilizing instructions appearing at said output of said pin memory circuit to time a desired interval between a present state of operation of said test pin and a next state of operation of said pin. The pin memory circuit is cycled to a next address to a new test instruction for said next state of operation of said test pin.

Another aspect of the invention includes an apparatus for testing an electronic circuit having a plurality of tester channels. Each channel includes a test pin means for contacting a test point of a unit under test, a pin memory circuit means for storing test instructions which direct the state of operation of said test pin, a channel control circuit means coupled between said pin and an output of said pin memory means for controlling the state of operation of said pin in response to test instructions appearing at said pin memory output, said channel control circuit means including programmable timer means responsive to instructions appearing at said pin memory means output to time a desired interval between a present state of operation of said test pin and a next state of operation of said pin, and means coupled to said timing means for generating the address of a next instruction in said pin memory means, said memory being cycled to said next address at the end of said programmed time.

Yet another aspect of the invention comprises an apparatus for testing an electronic circuit having a plurality of tester channels, each channel having a channel control circuit for controlling the state of operation of said channel in response to a sequence of test instructions stored in a respective memory circuit. The memory circuit includes a dynamic random access memory (DRAM) circuit means for storing said test instructions, and a cache memory circuit means coupled to said DRAM circuit and to said channel control circuit for storing a subsequence of test instructions from said DRAM circuit; said channel control circuit controlling the operation of said channel from the test instructions stored in said cache memory means while refreshing said DRAM circuit, thereby permitting backward loops in said sequence of test instructions.

A further aspect of the invention includes a method for operating a multichannel tester for an electronic circuit having a plurality of channels, each channel having a channel control circuit for controlling the state of opeation of said channel in response to a sequence of test instructions stored in a respective dynamic random access memory (DRAM) circuit. Backward loops in said sequence of test insstructions are permitted by storing a subsequence of test instructions from said DRAM circuit in a cache memory circuit and operating said channel from the test instructions in said cache memory while simultaneously refreshing said DRAM circuit.

Another aspect of the invention comprises a method of operating a multichannel tester for an electronic circuit, each channel being controlled by a sequence of test instructions stored in a memory circuit. The memory is cycled to a next address to obtain a new test instruction and the new test instruction is decoded to determine the next state of operation by a channel, said decoding being dependent on the present state of operation of that channel.

A still further aspect of the invention includes a multichannel tester for an electronic circuit, each channel being controlled by a sequence of test instructions stored in a memory circuit. A means for cycling said memory to a next address to obtain a new test instruction. A means for decoding said new test instruction to determine the next state of operation by a channel, said decoding being dependent on the present state of operation of that channel.

DETAILED DESCRIPTION

Figure 1:
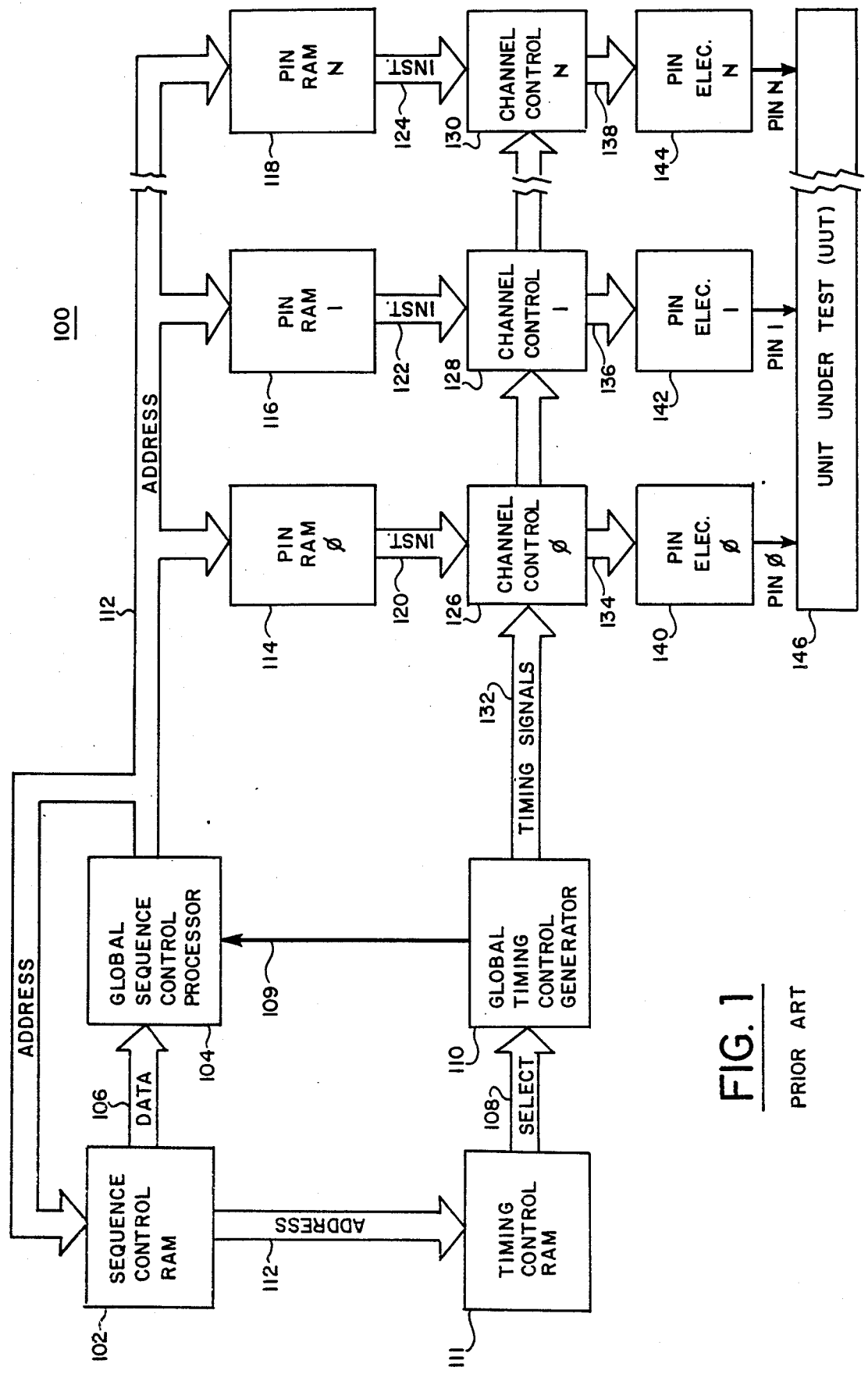
FIG. 1 is a block diagram of a prior art shared resource system.
Figure 2:
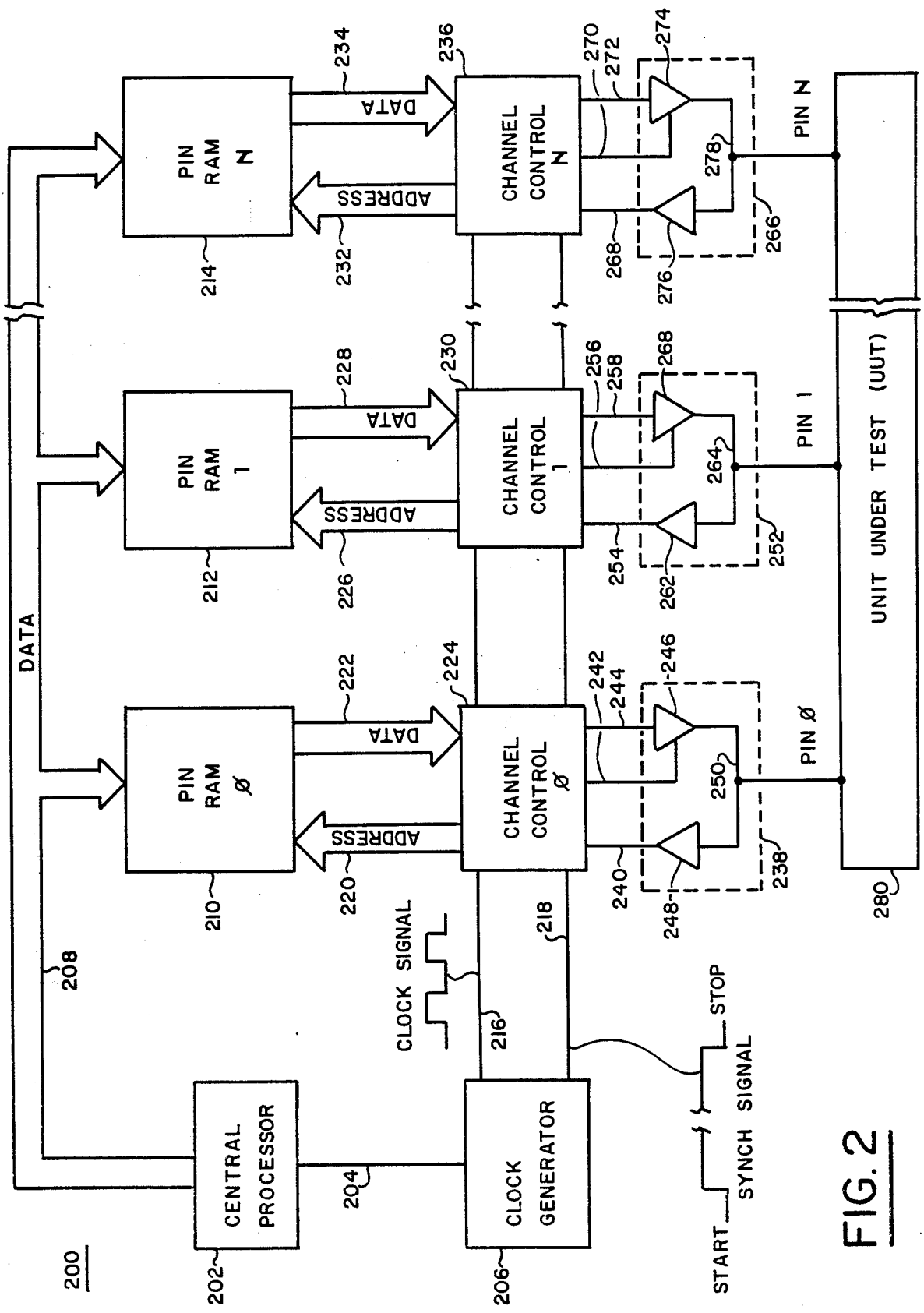
FIG. 2 is a block diagram of one embodiment of a system in accordance with the present invention.

Referring to FIG. 2, a functional tester in accordance with the present invention is generally shown as 200. As in FIG. 1, the tester is shown as having three channels, ∅, 1 and n, for clarity of illustration, whereas it is common to have testers with 256, 512 or more channels. The tester is again organized so that each channel has its respective pin RAM channel control circuit and pin electronics. Thus, pin RAM 210 is coupled to channel control 224 via instruction bus 222 and address bus 220 and channel control 224 is coupled to pin electronics 238 via lines 240, 242 and 244 to form channel ∅. Similarly, pin RAM 212 is coupled to channel control 230 via instruction bus 228 and address bus 226 and channel control 230 is coupled to pin electronics 252 via lines 254, 256, 258 to form channel 1; pin RAM 214 is coupled to channel control 236.via instruction bus 234 and address bus 232 and channel control 236 is coupled to pin electronics 266 via lines 268, 270, 272 to form channel N. Each of the channel control circuits are coupled to their respective connector pin which are brought into contact with the connector of the unit under test (UUT) 280. Thus, pin electronics 238 is coupled to pin 0 via line 250, pin electronics is coupled to pin 1 via line 264 and pin electronics 266 is coupled to pin N via line 278.

In the illustrated embodiment, the pin electronics is suitable for sink/source logic circuits such as TTL or CMOS. Each contains a driver circuit which can be placed in a high impedance (tri-state) output state and a receiver circuit. Other logic families would require different pin electronics.

In the embodiment illustrated in FIG. 2, the pin electronics 238 for channel 0 comprises a tri-state driver 246 coupled to the channel control 224 by line 244. Driver 246 can be placed in a high impedance output state by means of a signal on line 242. A data receiver 248 is coupled to pin 0 by line 250 and to channel control 224 by line 240. Similarly, the pin electronics 252 for channel 1 comprises driver 268 and receiver 262. Driver 268 is coupled to channel control 230 by line 258 and can be place in a high impedance state by a signal on line 256. Data receiver 262 is coupled to pin by line 264 and to channel control 230 by line 254. The pin electronics 266 for channel N comprises driver 274 and receiver 276. Driver 274 is coupled to channel control 236 via line 272 and can be placed in a high impedance state by a signal on line 270.

The pin electronics 238, 252, 266 may be coupled to the channel controls 224, 230, 236 by a line carrying encoded instructions instead of the technique illustrated in FIG. 2. This is because the pin electronics are located very close to the UUT in order to preserve the integrity of the drive or received signals whereas the remainder of the electronics may be in another portion of the tester and coupled to the pin electronics by a cable which is relatively long in view of the high operating speeds. The encoded signals would be decoded and perform the same functions shown in FIG. 2. The details of such an arrangement are well known to those skilled in the art and need not be repeated here.

Each of the pin RAMs 210, 212, 214 are coupled to the central processor 202 by means of an instruction bus 208. The central processor 202 is also coupled to a clock generator 206 by means of control line 204. The clock generator 206 generates a clock signal which is present on line 216 and coupled to all of the channel control circuits within the tester. Clock generator 206 also generates a synchronizing (hereinafter "synch") signal which is present on line 218 and also coupled to all of the channel control circuits in the tester.

Although each of the pin RAMs receive an input from a bus which is common to all of the RAMs, similar to circuits shown in FIG. 1, it should be carefully noted that the common bus in FIG. 2 is an instruction bus whereas the common bus in FIG. 1 is an address bus. The instruction bus shown in FIG. 2 is used prior to the test to be performed by the tester. During this phase of operation, it is necessary to load the instructions to be performed during the test into each of the pin RAMs. The central processor 202 addresses each of the pin RAMs by means not shown and loads the instructions which perform the desired test into the pin RAM. Alternatively, bus 208 could be connected to all of the channel controllers and the instructions loaded into the pin RAMs by the channel controllers. The instructions provided on instruction bus 208 could come from the memory associated with the central processor 202 but more commonly will come from a magnetic tape or disk, although other sources could obviously be used. After the central processor 202 has loaded the instructions into all of the pin RAMs in the tester, the instruction bus 208 plays no further part in the operation of the tester. It should also be noted that the tester shown in FIG. 1 also requires this means of initially loading the instructions into the pin RAMs and that this has been omitted from FIG. 1 for clarity of illustration.

Accordingly, once the tester 200 has been loaded with the test program, there is no centralized control over the address utilized to fetch an instruction from the pin RAM. The address for each pin RAM is sent over its respective address bus from its respective channel control circuit. For example, in channel 0, the address for in RAM 210 is provided over address bus 220 from channel control 224. Thus, the generation of the address for channel 0 is independent of the address generation for all other channels in the tester. This in turn eliminates the need to cycle each pin RAM in order to generate the required test sequence. The channel control therefore only cycles the memory when it is necessary to obtain a new instruction for changing the state of that channel which greatly reduces the amount of data that must be stored in the tester in order to generate the test sequence. The detailed operation of the channel control circuit will be described in connection with FIGS. 3, 4, 5 and 6. The ability to operate each channel independent of the other so that the memory need only be cycled when it is necessary to obtain a new test instruction to modify the state of operation of that channel makes each channel, in effect, an independent tester. Accordingly, the architecture of this tester may be referred to as a "true tester-per-pin" architecture.

Each channel of the tester operates in the same manner although independently. Referring to channel 0 as an example, channel control circuit 224 will produce an address on bus 220 when it is necessary to fetch a new instruction from pin RAM 210 in order to change the state of operation of channel 0. The new instruction is sent to channel control 224 via instruction bus 222 from pin RAM 210. Channel control 224 decodes the instruction to determine whether or not pin driver 246 is to be activated. If driver 246 is to be activated to drive the pin to a high or low state, the appropriate signal is placed at the input of the driver and the pin is driven to either a high or a low state as required by the test instruction. If the driver is not to be activated but data is to be received via receiver 248, then a signal is provided on line 242 to place the output of the tri-state logic driver 246 into its high impedance state. In this state, the driver 246 has no effect on the signal being received by the data receiver 248. If data is to be received, it will be compared against the expected value of that data and the results sent to the central processor by means not shown.

Although each channel operates independently, all channels operate in synchronism with a clock signal provided on line 216. The clock signal shown in FIG. 2 is a typical clock signal that might be utilized for this system having, for example, a 100 MHz rate with a 5 nanosecond segment in the high state and a 5 nanosecond segment in the low state. This signal is continuously generated and all memory cycles would occur on the leading edge of the clock signal on line 216. Synchronization is obviously required because it is necessary that the data change in accordance with the protocol (Operating requirements) of the circuits, particularly integrated circuit logic and microprocessors, utilized on the electronic circuit board. As the clock signal is continuously generated, it is necessary that the test sequence on all pins be started or stopped in synchronism. Accordingly, a line 218 is provided with a synch signal which is generated by clock generator 206 under control of the central processor 202 via control line 204. The test sequence is started for all channels on the leading edge of the synch signal which occurs in the middle of a clock period so that all channels will start on the next clock edge. A time monitor in clock generator 206 keeps track of the length of the test and stops the test sequence by changing the state of the synch signal. It should be noted that two short pulses, one to start the test and another to stop the test, could be used in place of the single long pulse illustrated.

Figure 3:
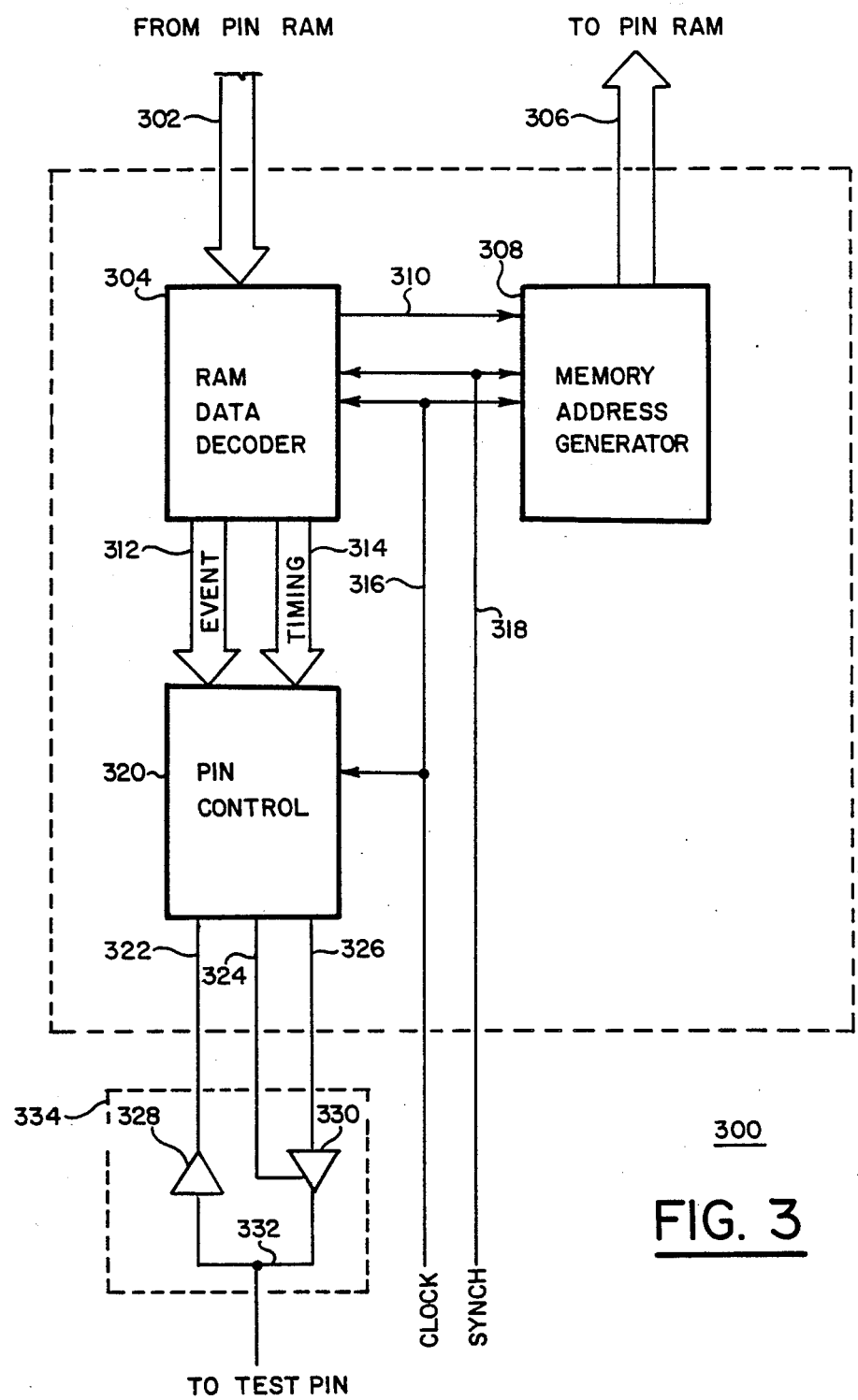
FIG. 3 is a more detailed block diagram of a channel control circuit in accordance with the invention shown in FIG. 2.

FIG. 3 shows a more detailed block diagram of a channel control circuit 224, 230 or 236, generally shown as 300. The channel control circuit has a RAM data decoder 304 which is coupled to the pin RAM via instruction bus 302. The instruction bus would correspond to bus 222, 228 or 234 in FIG. 2. The RAM data decoder 304 is also coupled to a memory address generator 308 via line 310. Memory address generator 308 is in turn coupled to the pin RAM, such as RAM 210, 212 or 214 via address bus 306 which corresponds, for example, to buses 220, 226 or 232. RAM data decoder 304 is coupled to a pin control circuit 320 via data buses 312 and 314. Pin control circuit 320 is coupled to pin electronics 334 via lines 322, 324 and 326. The pin electronics comprises a pin driver 330 coupled to pin control circuit 320 via line 326. The tri-state input of driver 330 is coupled to the pin control circuit 320 via line 324. Pin control 320 receives data from a data receiver 328 via line 322. Data receiver 328 and pin driver 330 are coupled together via a line 332 which is also coupled to the respective test pin of that channel. RAM data decoder 304, memory address generator 308 and pin control 320 are connected to the clock generator 206 via line 316. RAM data decoder 304 and memory address generator 308 are also connected to the synch signal generator in clock generator 206 via line 318.

RAM data decoder 304 receives a word from the output of the pin RAM via instruction bus 302. This word is the next instruction in the test sequence for that channel and will change the state of operation of that channel and only that channel. The RAM data decoder 304 decodes this word to generate a data word which determines the type of event that will take place on the pin coupled to that channel of the tester. The RAM data decoder 304 also decodes the instruction to produce a word which determines the timing of the event which will be explained in detail below. A detailed description of the operation of decoder 304 will be presented below in conjunction with FIG. 4. Pin control 320 utilizes the event data word and timing data word to generate signals to the pin electronics 334 to drive the pin connected to the UUT or to receive data from the UUT. The major difference between pin control 320 and a corresponding portion of the channel control circuits of the prior art is that pin control 320 is programmable to generate the required timing information for each pin event. In the prior art, the electronics selected one of a predetermined number of timing signals which either were externally generated for all of the channels of the tester or internally generated for each channel of the tester in accordance with instructions loaded into each channel at the start of the test. Neither prior art system provided, therefore, the flexibility to have the timing for each pin event independent of any other pin event in the test sequence. It is this flexibility that allows the tester to follow exactly the test pattern required for the UUT and also permits the memory reduction described above. The generation of a typical test sequence for one pin of a tester will be discussed below in connection with FIG. 5 and Table 1.

Memory address generator 308 generates the address of the next instruction to be retrieved from the pin RAM for that channel. This address is coupled to the pin RAM via bus 306 which corresponds, for example, to the buses 220, 226 and 232 of FIG. 2. The memory address generator is responsive to a signal from RAM data decoder 304 coupled via line 310 to generate the next memory address. In the embodiment shown, looping in the test sequence in order that a portion of the sequence be repeated a predetermined number of times, is not provided. This is discussed below in conjunction with FIG. 6.

Figure 4:
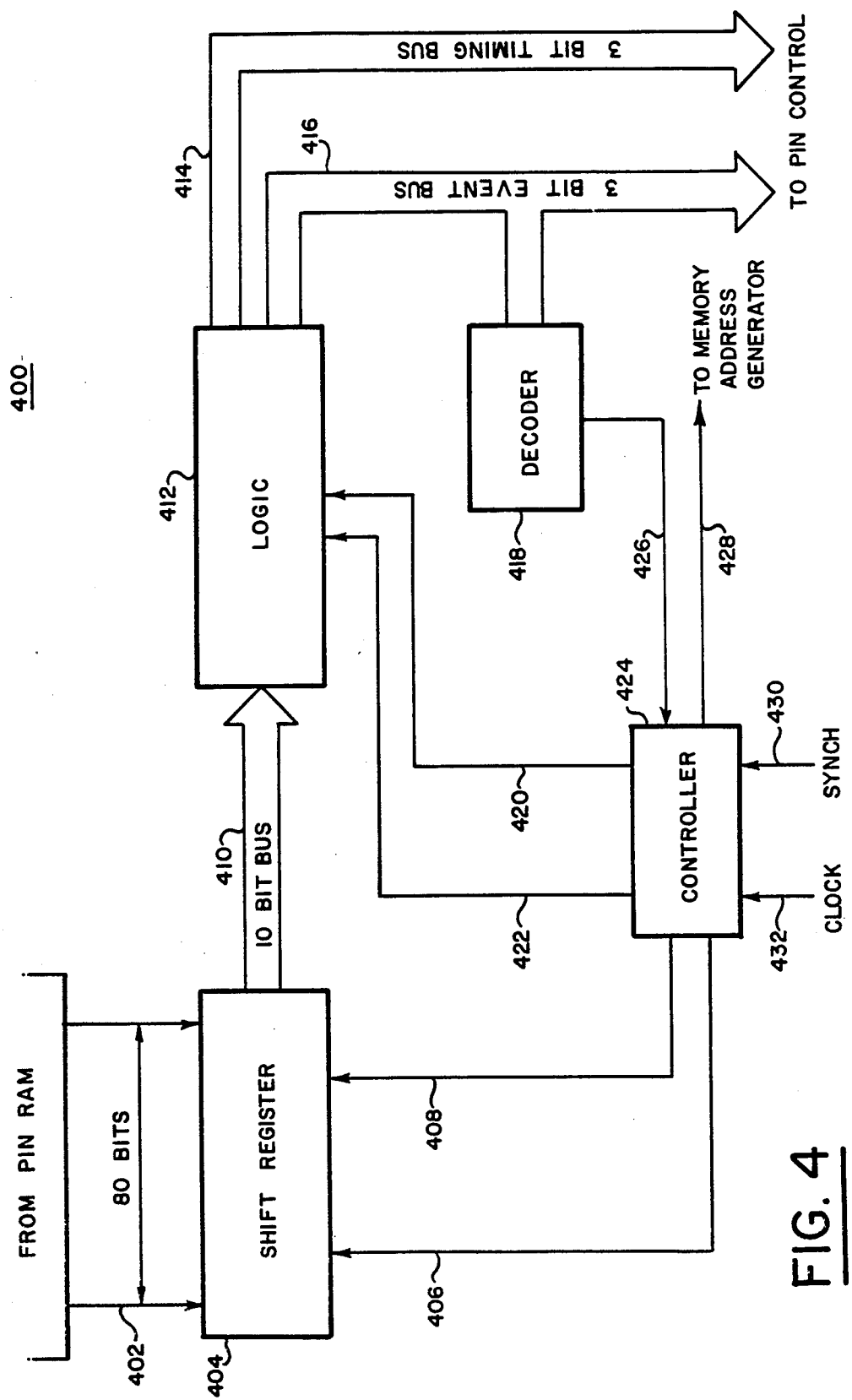
FIG. 4 is a block diagram of the RAM data decoder shown in FIG. 3.

FIG. 4 shows a more detailed block diagram of the RAM data decoder 304, generally shown as 400. The data bus 302 is shown as bus 402 which, as illustrated, is 80 bits wide. The width of data bus 402 is determined by the cycle time of the pin RAMs and the time resolution that is desired. For example, if it is desirable to use DRAMs having a cycle time of 80 nanoseconds and if we want a resolution of 1 nanosecond per bit, this yields a word width of 80 bits. Although a wide word is required, the system is still very cost effective because it enables the use of the very low cost DRAM memory circuits. SRAMs have a much faster cycle time and will thus permit the use of shorter word widths, but their greater expense results in a system which is far less cost effective. In the event of continually changing pin events, the 80 bit word enables a word to be read out as fast as the memory can cycle while still maintaining the desired resolution of 1 bit of the word representing 1 nanosecond of the test sequence.

The 80 bit word is clocked into shift register 404 in parallel by a signal on line 406. The signal on line 406 is generated by the controller 424 in response to the signals on clock line 432 and synch line 430. Clock line 432 corresponds to the clock line 216 of FIG. 2 and synch line 430 corresponds to synch line 218 of FIG. 2. In order to process the data word at the rate of 1 bit per nanosecond, a 1 GHz clock signal would normally be required. The generation of such a high frequency clock signal is a difficult task as well known to those skilled in the art. In addition, in a system as large as a tester having hundreds of channels, the time skews introduced by the long lines of cabling required to couple this signal from a global timing generator to each of the channels further exacerbates this problem. The present invention overcomes this problem by utilizing a 100 MHz clock on line 408 to shift out a 10 bit word in parallel on each clock transition. The 10 bit word comprises ten contiguous bits of the 80 bit word present on bus 402. The 10 bit word is shifted to logic circuit 412 via 10 bit wide bus 410. Shifting a 10 bit word every 10 nanoseconds produces the equivalent resolution of 1 bit per nanosecond without the need for the 1 GHz clock and its attendant problems. Logic circuit 412 decodes the information of the 10 bit word as well as information that may have been present in the previous 10 bit word to produce a 3 bit event word on bus 416 and a 4 bit timing word on bus 414 which are coupled to the pin control circuit 320, as shown in FIG. 3. The 4 bit timing word on bus 414 is used to select a signal from a timing generator (not shown) which positions the event in time in accordance with the position of the instruction in the 10 bit word.

For example, if the first bit of the instruction, which is a flag bit and always a "1" (see the description of FIG. 5 and Table 1 below) is in the seventh position in the ten bit word, then a signal will be selected by using the 4 bits to operate a ten channel multiplexer, which will start that instruction 7 nanoseconds after that 10 bit word was processed by logic circuit 412. Logic circuits capable of performing this function are known in the art and need not be described in detail here. The manner in which the data is encoded to produce the desired event tming is discussed in more detail below in conjunction with FIG. 5 and Table 1. The logic circuit 412 utilizes a biphase clock signal present on lines 420 and 422 to process the information coupled to it from bus 410. The signal on line 422 is 180° out of phase with the clock signal on line 420. If the event on bus 416 is a time delay (hereinafter a "holdoff"), this is detected by decoder circuit 418 which signals to the controller 424 by a signal on line 426. A holdoff causes the value of the time delay (see the description of FIG. 5 and Table 1 below) to be loaded into a programmable counter within controller 424. This counter is clocked by the clock signal on line 432 to generate a signal on line 428 that stops the operation of memory address generator 308 for the duration of the holdoff. The programming of the holdoff is best understood by referring to the description of FIG. 5 and Table 1 below.

Figure 5:
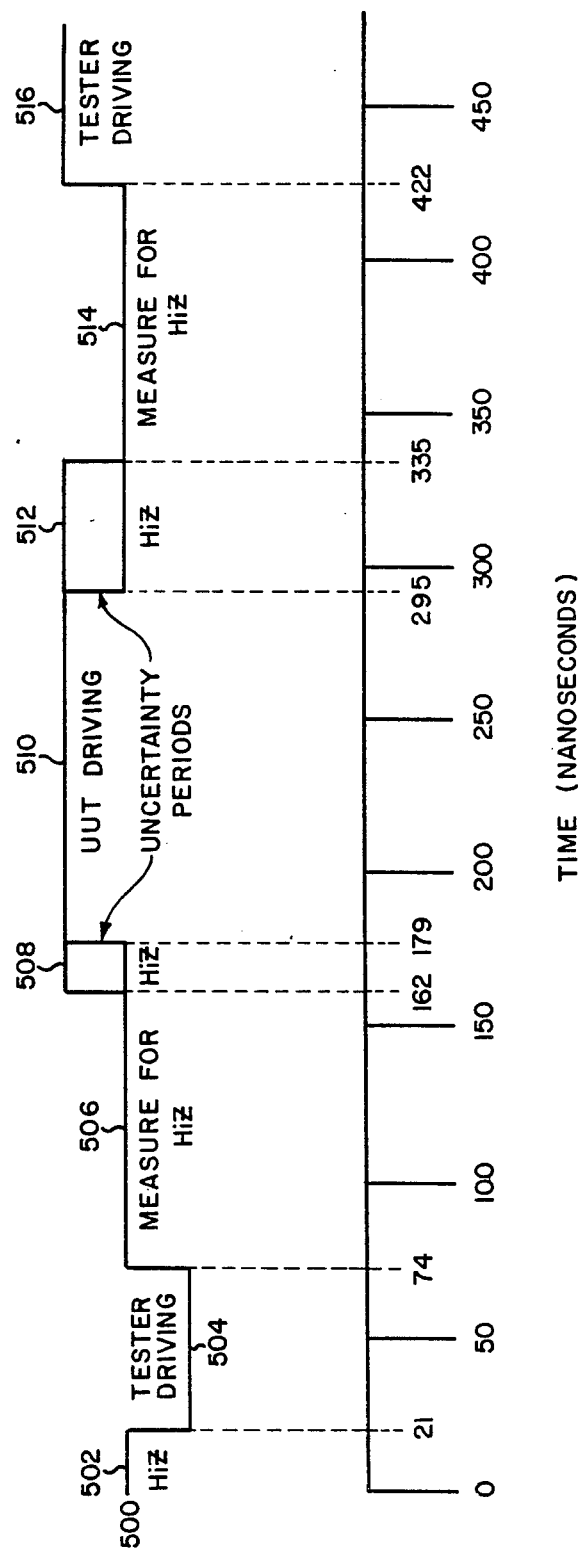
FIG. 5 is a timing diagram illustrating a typical test sequence on one pin of the tester in accordance with the present invention.

FIG. 5 shows a signal 500 which is representative of a sequence of events which is desired on one particular channel of the tester. It should be understood that there is a time delay associated with the processing of the commands to generate this signal as well as a time delay associated with the length of wire between the channel circuitry and the pin. However, by carefully designing the tester so that the time delay for each channel is identical, for example, 100 nanoseconds, then the relative timing on all pins will be the same and this factor can be ignored. Likewise, it is understood that the transitions between different states of the signal do not occur in zero time as shown on the drawing. For purposes of illustration, it has been assumed that these transitions occur fast enough so that they can be considered as occurring instantly. The signal 500 is shown as starting at zero time and continuing beyond the 450 nanosecond time scale. The time scale is divided in 50 nanosecond increments and all of the transitions are labelled with the actual running time of their occurrence.

The waveform starts at zero time in the high impedance state as shown by segment 502. This state, as described above, is the result of switching the tri-state driver into its high impedance state. For example, in FIG. 2, driver 246 of channel Ø can be placed on its high impedance state by a signal on line 242. In this state the driver neither drives the pin high or low so that the state of the pin could be measured, if desired, without interference from the driver. As shown in segment 502, however, no measurement is being made. Twentyone nanoseconds after the start of the test it is desired to have the tester drive the pin of the UUT to a low state, as shown by segment 504. The tester remains in this state for 53 nanoseconds which corresponds to 74 nanoseconds after the start of the test. At this time it is desired to have the tester go to a measure for a high impedance state as illustrated by segment 506. In this state the tester measures for a high impedance on that channel provided by a tri-state output of the UUT circuit. The tester remains in this state for 88 nanoseconds until a time of 162 nanoseconds. At 162 nanoseconds after the start of the test, it is expected that the UUT will be driving the pin high as illustrated by segment 510. However, due to variations in the propagation delays of the signals within the UUT, it is known that there will be a 17 nanosecond period of uncertainty shown as segment 508 from a time of 162 nanoseconds to a time of 179 nanoseconds. The duration of this uncertainty period might have been calculated, for example, by a simulation program analyzing the circuitry of the UUT. Accordingly, the measurement for a high impedance state will be stopped at the start of this uncertainty period and that channel of the tester remain in the high impedance state and simply wait out the 17 nanoseconds. During segment 510, the tester will be measuring for the expected high condition on the pin. At 295 nanoseconds from the start of the test it is expected that the UUT will stop driving the pin. Again, due to variations of a propagation delay of the signals that ultimately generate this state, there is an uncertainty period 512 of 40 nanoseconds from 295 to 335 nanoseconds from the start of the test. Again, that channel will wait out the uncertainty period by being instructed to enter the high impedance state. After the end of the uncertainty period, at 335 nanoseconds from the start of the test, it is desired to have the pin again return to the measure for a high impedance state as illustrated by segment 514. The tester remains at this state for 87 nanoseconds until 422 nanoseconds from the start of the test at which point it is desired to have the tester drive the pin of the UUT as shown by segment 516.

Table 1 lists the instructions needed to generate the signal 500 illustrated in FIG. 5. The necessary instructions require two complete 80 bit words labelled words 1 and 2 and a portion of a third word labelled word 3. These words are the 80 bit words which are generated by the pin RAM and appear on data bus 402 shown in FIG. 4. For clarity of illustration, each of the words has been broken up into eight 10 bit segments labelled a through h with each of the bits in the segments labelled Ø through 9. These segments correspond to the 10 bit segments which would be shifted out of shift register 404 onto bus 410 in FIG. 4. In addition, parentheses have been placed around groups of 5 bits known as "packets" which comprise instructions or data that are interpreted by logic circuit 412 in FIG. 4. For clarity, five letter mnemonics have been substituted for the 5 bits of those packets which represent instructions. It should also be noted that the use of a context-dependent coding technique enables these instructions to be encoded using only 3 bits, the other bits being reserved for future purposes. This context-dependent coding will be described below in conjunction with Table 2. It should also be understood that the parentheses appear as an aid to the reader in identifying the packets and obviously do not appear in the bit stream. Each packet is always preceded by a "1" which signifies the presence of the packet to the decoder. Thus, a packet actually requires 6 bits.

Referring now to FIG. 5 and Table 1, we will now see how the instructions of Table 1 are utilized to generate the desired test sequence illustrated in FIG. 5. The tester starts the test sequence in its high impedance state represented by segment 502. This is programmed into the channel control circuit, by means not shown, before the test is run. The first transition in the test sequence occurs at 21 nanoseconds after the start of the test. Accordingly, the tester is instructed to remain in the high impedance state for the first 21 nanoseconds. As stated earlier, each bit of the instruction word represents 1 nanosecond of the test sequence. Accordingly, a 21 nanosecond delay utilizes 21 bits. The first 10 bits of the test sequence are those of segment a of word 1 in Table 1. This segment consists of all zeros. Similarly, segment b of word 1

TABLE 1

|  | Segments | Bits | | | | | | | | | |
|---|---|---|---|---|---|---|---|---|---|---|---|
|  |  | 0 | 1 | 2 | 3 | 4 | 5 | 6 | 7 | 8 | 9 |
| WORD 1 | a | 0 | 0 | 0 | 0 | 0 | 0 | 0 | 0 | 0 | 0 |
|  | b | 0 | 0 | 0 | 0 | 0 | 0 | 0 | 0 | 0 | 0 |
|  | c | 0 | 1 | (G) | 0 | L | O | (W) | 1 | (H) | D |
|  | d | O | F | (F) | 1 | (0) | 0 | 0 | 0 | (0) | 1 |
|  | e | (0) | 0 | 0 | 1 | (0) | 0 | 0 | 0 | 0 | 0 |
|  | f | 0 | 0 | 0 | 0 | 1 | (M) | S | H | I | (Z) |
|  | g | 1 | (H) | D | O | F | (F) | 1 | (0) | 0 | 0 |
|  | h | 0 | (0) | 1 | (0) | 0 | 1 | 1 | (0) | 0 | 0 |
| WORD 2 | a | 0 | 0 | 1 | (S) | M | H | I | (Z) | 0 | 0 |
|  | b | 0 | 0 | 0 | 0 | 0 | 0 | 0 | 0 | 0 | 1 |
|  | c | (M) | S | F | H | (I) | 1 | (H) | D | O | F |
|  | d | (F) | 1 | (0) | 0 | 0 | 0 | (0) | 1 | (0) | 1 |
|  | e | 0 | 0 | (1) | 0 | 0 | 1 | (S) | M | S | H |
|  | f | (I) | 1 | (H) | D | O | F | (F) | 1 | (0) | 0 |
|  | g | 0 | 0 | (0) | 1 | (0) | 0 | 0 | 0 | (1) | 0 |
|  | h | 0 | 0 | 0 | 0 | 0 | 1 | (M) | S | H | I |
| WORD 3 | a | (Z) | 1 | (H) | D | O | F | (F) | 1 | (0) | 0 |
|  | b | 0 | 0 | (0) | 1 | (0) | 0 | 1 | 1 | (0) | 0 |
|  | c | 0 | 0 | 1 | (G) | 0 | H | I | (G) | 0 | 0 | consists of all zeros. These two segments provide a total of 20 nanoseconds of delay. The first bit, bit 0 of segment c is a 0 which provides the final nanosecond of the 21 nanosecond delay. The second bit of segment c, bit number 1, is a 1 which is a flag to indicate that the next 5 bits are a packet. This packet, identified by the parentheses, contains the digital code for the instruction go low, here illustrated as the mnemonic "GOLOW". This instruction is decoded by logic circuit 412 of FIG. 4 to produce a 3 bit code on bus 416 which will activate the channel control circuit to direct the pin electronics for that channel to drive the pin of that channel low.

The tester continues to drive the pin to a low state for a period 53 nanoseconds. Accordingly, the next instruction to change the state of the pin will not occur for 53 nanoseconds. The attendant time delay could be produced by inserting zeros as was done for the 21 nanosecond delay between the start of the test and the instruction for the tester to drive the pin low. However, this time delay is provided here by a second technique which is more useful for longer time delays as it utilizes a greatly reduced number of bits for a large time delay. Following the packet containing the instruction "GOLOW" there are three additional packets of information. The first packet contains the instruction that a "holdoff" will occur, here illustrated by the mnemonic "HDOFF". The second and third packets contain the length of time for the holdoff in 10 nanosecond intervals. The packet containing bits 4 through 8 of segment d does not introduce a time delay whereas the packet containing bits 0 through 4 of segment e introduces a time delay of 20 nanoseconds. These series of packets are followed by nine zeros which introduces a further time delay of 9 nanoseconds, where 1 bit equals 1 nanosecond in the time sequence. At first glance, it would seem that only a 29 nanosecond delay has been introduced by this series of commands. However, it must be remembered that each bit in the instructions represents 1 nanosecond in the time sequence. If we start with bit number 1 of segment c and count the number of bits through bit number 4 of segment e we see that the instructions themselves utilize 24 bits. These 24 bits represent a time delay of 24 nanoseconds irrespective of the 29 nanosecond delay introduced by the instructions and the zeros for a total of 53 nanoseconds of time delay. Notice that utilization of this technique has enabled us to introduce a 53 nanosecond delay by utilizing only 27 additional bits. However, it should be noted that this is the worst case situation regarding the number of bits required, that is, nine zeros were required after the holdoff instruction in order to obtain the proper delay. It should be understood, that the 10 bits in the two packets that follow the holdoff command theoretically permit time delays up to $2^{10}=1,024$ ten nanosecond delays or 10,240 nanoseconds. Longer time delays can be provided by increasing the number of packets used to designate the holdoff time. The significance of this technique is that 3 packets plus a maximum of 9 bits, which equals 27 bits, is all that is required for any time delay up to 10,240 nanoseconds that might be utilized in a test sequence. This means that there is no need to cycle the memory to merely receive another no-op instruction. Thus, this contributes to the compression of a number of instructions required to carry out a particular test program. The only practical limitation is that the minimum time delay is 3 packets of information or 18 bits, which equals 18 nanoseconds. Delays shorter than 18 nanoseconds require the use of a string of zeros to produce the time delay.

At the end of the 53 nanosecond delay the tester will be at bit number 4 of segment f which is the start of a packet to instruct the tester to go to the measure for high impedance state here indicated by the mnemonic "MSHIZ". The tester is to remain in this state for a period of 88 nanoseconds. This time delay is initiated by the packet starting with the 1 bit at segment g, bit number 0. This packet initiates a holdoff with a time delay defined by the next two packets starting as segment g, bit number 6 and segment h, bit number 2. The first packet has a time delay of 0 and the second packet has a time delay of 6 or 60 nanoseconds. The instructions themselves take 24 bits or 24 nanoseconds for a total time delay of 84 nanoseconds. In order to obtain the required 88 nanosecond time delay, four zeros are added at segment h, bits 8 and 9 and in word 2, segment a, bits 0 and 1.

At 162 nanoseconds from the start of the test, the test enters the first uncertainty period of 17 nanoseconds. At the start of this time period, the tester is instructed to stop measuring for the high impedance state, indicated by the mnemonic "SMHIZ" in the packet starting at word 2, segment a, bit 2. This instruction places the channel in the high impedance state and requires 6 bits or 6 nanoseconds of time. Therefore, it is followed by 11 zeros in order to generate the 17 nanosecond delay. Note that the "holdoff" technique cannot be used here because that technique provides a minimum of 18 nanoseconds of delay. Word 2, segment b, bit 9 is the bit which signals another packet containing the instruction for the tester to measure for a high signal as a UUT is expected to be driving. This is indicated in this packet as the mnemonic "MSFHI". The tester remains in this state for a period of 116 nanoseconds. This time delay is provided by a holdoff starting with word 2, segment c, bit 5. The value of the holdoff is indicated by the packet starting at word 2, segment d, bit number 7 which has a value of 9 to 90 nanoseconds. These instructions take 4 packets or 24 bits which provides a time delay of 24 nanoseconds. The 24 nanoseconds and the 90 nanoseconds provided by the holdoff provide a waiting period of 114 nanoseconds. Therefore, the 4 packets are followed by 2 zeros which would provide the remaining 2 nanoseconds of the required 116 nanosecond time delay.

At the end of segment 510 at 295 nanoseconds after the start of the test, the UUT is expected to stop driving. However, because of the variations in the propagation delays of the signals within the UUT, it is known that there will be a 40 nanosecond period of uncertainty shown as segment 512, a time of 295 to a time of 335 nanoseconds after the start of the test. The next instruction starting with word 2, segment e, bit 5, is to stop the measurement for a high indicated by the mnemonic "SMSHI" so that the channel remains in a high impedance state. This is followed by a packet of information indicating a holdoff for 10 nanoseconds followed by 6 zeros to complete the 40 nanosecond delay which produces the uncertainty period 512. The 4 packets that make up the instructions to generate this time period utilize 24 bits or 24 nanoseconds. The 10 nanosecond time delay produced by the fourth packet and the 6 nanosecond time delay produced by the 6 zeros completes the 40 nanosecond time delay.

At the end of this uncertainty period, at 335 nanoseconds from the start of the test, the tester is commanded to go into the measure for a high impedance state to generate segment 514. The packet containing this instruction starts with the last 5 bits of word number 2 and concludes with the first bit of word number 3. The instruction is again indicated by the mnemonic "MSHIZ". The instruction is followed by a packet starting at word 3, segment a, bit 1 which starts a holdoff determined by the following two packets to be 60 nanoseconds. The 4 packets utilize 24 bits or 24 nanoseconds which combine with the 60 nanosecond holdoff and the 3 zeros which follow the 4 packets produces the 87 nanosecond time delay for segment 514.

At 422 nanoseconds after the start of the test, the tester drives the UUT as shown by segment 516. The command starts at word 3, segment c, bit 2 and is indicated by the mnemonic "GOHIG" for go high. The 2 zeros which complete segment c of word 3 are merely illustrative since the end of segment 516 is not shown.

Thus, we have generated a test sequence involving eight separate states for that particular channel of the tester and taking more than 422 nanoseconds to generate utilizing only 190 bits of stored instructions. Furthermore, the operations on that particular channel of the tester are completely independent of any other operations on the other channels of the tester. Therefore, that channel of the tester can be programmed separately from all other channels of the tester and the program can exactly follow the desired test pattern for that channel to within the nearest nanosecond. In fact, there are two "spare" bits in the 5 bit packet which are not needed to identify the instruction to be performed. These "spare" bits could be utilized as a vernier function to provide resolution down to the nearest 250 picoseconds. Obviously this technique could be expanded to provide nearly any desired resolution.

The removal of the compromises between the operations of the various channels and the ability to have virtually any desired resolution allows the program for a particular test to be generated by a computer. Typically, the circuitry of the UUT is analyzed by a simulation program which simulates the actual operations of the circuit utilizing typical and worst case tolerances of the components. The outputs of such simulation programs can now be utilized by another program to generate a test sequence for the UUT which can be directly entered into the functional tester. This saves a great deal of programming time, allows the program to be easily changed to accommodate last minute changes to the circuitry or changes in the tolerances of the components and eliminates the need for manual intervention which can result in errors in the test sequence. The result is a better test which is programmed much faster and for much less cost.

Another technique for reducing the amount of stored instructions that are required to produce a test sequence is the use of looping. In a test loop, a given sequence of instructions is repeated a predetermined number of times on a particular channel. For example, a clock signal changes state at a regular frequency. Assuming that the high and low states of the clock signal are identical, a program for generating a continuous clock signal comprises only three instructions. The first instruction is "change state". The second instruction provides a suitable time delay for the length of time for one-half of the clock cycle and the third instruction says go back to the first instruction. Contrast this with a series of instructions providing the constant changing of state and constant delay for the entire test sequence. In most cases, the number of instructions required cannot be reduced as greatly as can be done for a clock, but this technique can be utilized to reduce the amount of programming for certain portions of the test sequence for that channel.

One of the problems with the use of looping is that prior art techniques have required the use of SRAMs which are relatively expensive. This is because it is not possible to guarantee the refreshing of DRAMs in a looping situation. In DRAMs, each bit of information is typically stored in a two dimensional matrix having "horizontal" rows and "vertical" columns. The information is typically stored as a charge which is present at that particular location on the matrix for a very short period of time, typically 4 milliseconds. The memory must be "refreshed" by recharging the capacitor that forms a storage for that particular bit at least as often as the minimum time. This requires accessing of the "horizontal" row at least that often which refreshes all of the bits in that row. By properly designing the tester, one can be guaranteed that all of the rows will be accessed within a given period of time provided the program progresses in a linear fashion. However, if the program allows for looping, this cannot be guaranteed and hence the program may be lost. SRAMs do not require refreshing which eliminates the problem but at a very much higher cost per bit of storage.

The present invention allows for the use of "back looping" with the use of DRAMs. Back looping means that loops can only go back to a previous instruction and cannot jump to a future instruction. With this one provision, a tester using DRAMs can be built in which looping is permitted.

Figure 6:
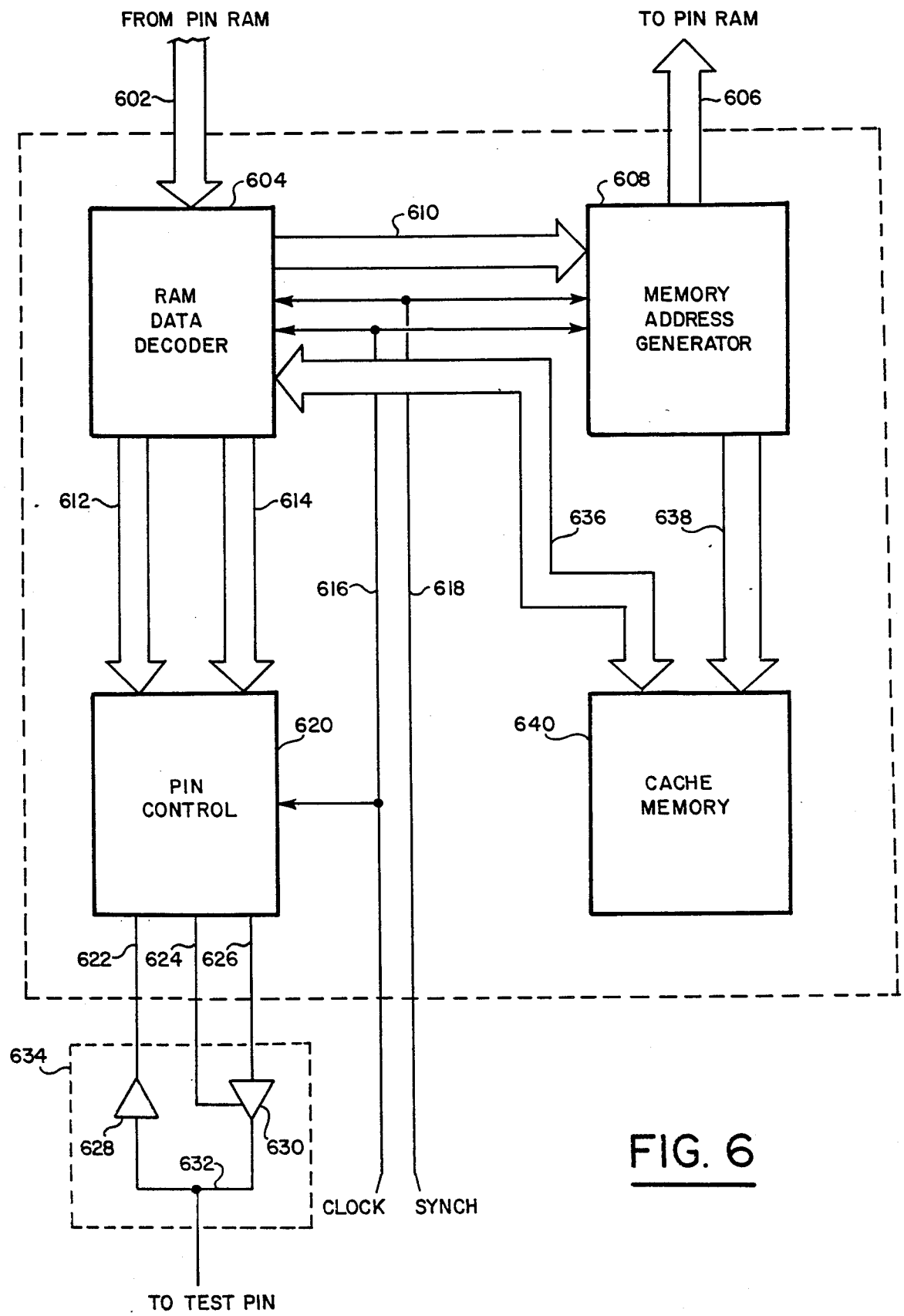
FIG. 6 is a block diagram of a channel control circuit which includes a cache memory.

FIG. 6 shows a detailed block diagram of a channel control circuit similar to the channel control circuit of FIG. 3, generally shown as 600. Those features that are the same as the features shown in FIG. 3 have been given the same reference numerals with the exception of the first numeral which is changed to a 6. The channel control circuit 600 could be the channel control circuit 224, 230 or 236 in FIG. 2. The RAM data decoder, pin control, pin electronics and memory address generator are identical to those shown in FIG. 3. Thus, the channel control circuit has a RAM data decoder 604 which is coupled to the pin RAM via instruction bus 602. The instruction bus would correspond to the bus 222, 228 or 234 in FIG. 2. The RAM data decoder 604 is also coupled to a memory address generator 608 via bus 610. It should be noted that in FIG. 3, line 310 comprised a single control line whereas in FIG. 6 it is a multibit wide bus. The memory address generator is in turn coupled to the pin RAM, such as RAM 210, 212 or 214 via address bus 606 which corresponds, for example, to buses 220, 226 or 232 in FIG. 2. RAM data decoder 604 is coupled to a pin control circuit 620 via data buses 612 and 614. Pin control circuit 620 is coupled to pin electronics 664 via lines 622, 624 and 626. The pin electronics comprises a pin driver 630 coupled to pin control circuit 620 via line 626. The tri-state input of driver 630 is coupled to the pin control circuit 620 via line 624. Pin control 620 receives data from data receiver 628 via line 622. Data receiver 628 and pin driver 630 are coupled together via line 632 which is also coupled to the respective test pin of that channel. RAM data decoder 604, memory address generator 608 and pin control 620 are connected to the clock generator 206 via line 616. RAM data decoder 304 and memory address generator 608 are also connected to the synch signal generator and clock generator 206 via line 618.

In addition, the channel control circuit 600 comprises a cache memory 640 coupled to the RAM data decoder 604 by a bidirectional bus 636 and coupled to the memory address generator 608 by bus 638.

Programming a loop requires that the address of both the first and last instruction in the loop as well as the number of times the loop is to be repeated be stored in the memory address generator 608. For the very first loop in a test sequence, this information is provided to the memory address generator prior to the start of the test by means not shown. When the memory address generator reaches the first address of the loop, it stores this instruction and all of the following instructions in the cache memory 640 until the last instruction in the loop is reached. These instructions are provided from RAM data decoder 604 over bus 636 to the cache memory under the control of the address generated on bus 638. When the last instruction in the loop is reached, the memory address generator will repeat the instructions stored in the cache memory for the number of times that it has been programmed. This comprises generating an address on bus 638 which causes the cache memory to send the instructions back over bidirectional bus 636 into RAM data decoder 604. During the loop, the RAM data decoder decodes the instructions arriving on bus 636 rather than the instructions on bus 602. However, one additional word is accessed from the pin memory via bus 602 into the RAM data decoder 604 and from there over bus 610 into memory address generator 608. This word, which comprises 80 bits, is used to instruct the memory address generator 608 of the first and last instructions and the number of repeat cycles for the next loop in the program. Because this instruction can be accessed while the RAM data decoder operates off the instructions in the cache memory, it is "transparent" to the program; that is, it does not affect the timing of that particular channel. This is true even though the instructions are in sequence in the same memory as the instructions for performing the test.

If the loop cycle is long enough so that data stored in the pin RAMs might be lost due to the lack of refreshing of the memory, a refresh counter in the memory address generator 608 is activated to generate "dummy" addresses which will be utilized to refresh the pin RAM. These dummy addresses address each of the "horizontal" rows in the pin RAMs to refresh the data. In a pin RAM having a minimum refresh time of 4 milliseconds and having 1,024 "horizontal" rows, one of the lines must be addressed approximately every 4 microseconds in order to guarantee the validity of the data. Thus, if the loop cycle were to approach 4 microseconds in length, the refresh counter would be activated. For shorter loops, it is not necessary to perform the refresh function. This refresh cycle is also utilized during a long holdoff cycle in order to avoid loss of data in the pin RAMs.

It should also be noted that loops which are unrestricted in length can be utilized even though the number of instructions required for the loop will not fit into the cache memory. In this event, the RAM data decoder runs from the cache memory until the number of instructions in the cache memory run out, when it returns to the instructions in the pin RAM to complete the loop. This overcomes the problem of needing instant access to the next instruction which cannot occur because of the rather long cycle times of DRAMs, as well as providing the necessary time to fetch and load the addresses and number of cycles for the next loop.

When the starting address for the next loop in the cycle is reached, these instructions are loaded into the cache memory by memory address generator 608 until the last instruction in loop is reached, when the process described above is repeated.

Another technique for reducing the amount of pin RAM required is the use of context-dependent coding. In the discussion of FIG. 5, it was mentioned that only 3 bits of a 5 bit packet are utilized to denote a particular instruction to the tester. The other 2 bits of the packet are spare bits which can be utilized, for example, to provide 250 picoseconds resolution, if desired. However, as would be easily recognized by one skilled in the art, the utilization of 3 bits to denote an instruction allows for only eight possible instructions. This is far too few to permit normal operation of the tester. Context-dependent coding eliminates this problem.

Table 2 shows the eight possible instructions, labelled 0 through 7, for each of four possible machine states. Up until now, we have been referring to the states of the pin of the UUT. Each channel of the tester functions as an independent tester. Each of these channels comprises a finite state machine which performs the assigned tasks. Finite state machines are well known in the art and need not be described here. However, in order to avoid confusion between the pin states and the machine states, the latter will be written in all capital letters, for example: DRIVE state. In Table 2 the instruction having the same instruction number in any of the states has the same binary code, that is, binary 0 through binary 7. To the right of the instruction numbers and the binary numbers are the description of what that particular code is interpreted by the tester to mean. If we compare the instructions for the various states we see that the same binary code is interpreted as different instructions depending upon the state that that channel of the tester is presently in. Thus, the tester makes use of the context of the tester operation in decoding the instruction. For example, instruction number 0 having a binary code of "000" means "go to DRIVE state" in the HIGH IMPEDANCE state. If, however, we were already in the DRIVE state, this instruction would make no sense. In the DRIVE state, the same instruction binary "000" means "toggle the high input and stay in the DRIVE state". Thus, this context-dependent coding provides for a reduced number of bits to designate a particular instruction by utilizing the state of that channel of the tester, in effect, as part of the code. This reduces the number of bits required for a given number of possible instructions. For example, if a tester has eight possible states, each of which have eight possible instructions, there are sixty-four possible instructions.

TABLE 2

| Instruction Number | Binary Code | Instruction |
|---|---|---|
| | | HIGH IMPEDANCE (HIZ) State |
| 0 | 000 | Go to DRIVE state |
| 1 | 001 | Next packet contains a holdoff count, stay in HIZ state |
| 2 | 010 | Conditional loop, test for low, stay in HIZ state |
| 3 | 011 | Conditional loop, test for high, stay in HIZ state |
| 4 | 100 | Conditional loop, no test, stay in HIZ state |
| 5 | 101 | Measure for low, enter MEASURE state |
| 6 | 110 | Measure for high, enter MEASURE state |
| 7 | 111 | Go to MEASURE FOR HIZ state |
| | | DRIVE State |
| 0 | 000 | Toggle the high output, stay in DRIVE state |
| 1 | 001 | Next packet contains a holdoff count, stay in DRIVE state |
| 2 | 010 | Conditional loop, no test, stay in DRIVE state |
| 3 | 011 | Go to HIZ state, toggle output |
| 4 | 100 | Go to HIZ state, output unchanged |
| 5 | 101 | Go to MEASURE FOR HIZ state, toggle output |
| 6 | 110 | Go to MEASURE FOR HIZ state, output unchanged |
| 7 | 111 | Spare |
| | | MEASURE State |
| 0 | 000 | Check for no transition |
| 1 | 001 | Check for one transition |
| 2 | 010 | Next packet contains a holdoff count, stay in MEASURE state |
| 3 | 011 | Conditional loop |
| 4 | 100 | Go to DRIVE state |
| 5 | 101 | Go to HIZ state |
| 6 | 110 | Go to MEASURE FOR HIZ state |
| 7 | 111 | Spare |

TABLE 2-continued

| Instruction Number | Binary Code | Instruction |
|---|---|---|
| | | MEASURE FOR HIZ State |
| 0 | 000 | Go to HIZ state |
| 1 | 001 | Go to DRIVE state |
| 2 | 010 | Next packet contains a holdoff count, stay in MEASURE FOR HIZ state |
| 3 | 011 | Conditional loop |
| 4 | 100 | Spare |
| 5 | 101 | Spare |
| 6 | 110 | Spare |
| 7 | 111 | Spare |

This would normally require 5 bits or all of the bits in a packet to encode these instructions. In the present invention, 2 bits are freed for use for other purposes, such as providing a greater timing resolution, without any loss in the ability to command the tester into various states.

If we compare the instructions in Table 2 with the mnemonics in Table 1, we see that there is not an exact match. For example, the first instruction in Table 1 occurs at word 1, segment c, bits 2-6, "GOLOW". There is no such instruction in Table 2. This is because the tester makes use of the fact that tri-state logic is utilized. In this type of logic, activation of the high impedance output overrides the input to the driver circuit and the driver output remains in the high impedance state. Therefore, the driver is in the high impedance state regardless of the signal on its signal input. Before the start of the test illustrated in Table 1, the channel is programmed to go into both the HIGH IMPEDANCE state and to provide a low output. The HIGH IMPEDANCE state dominates and the output goes to the high impedance value. When the first instruction in the test, for the output to go low is reached, the actual instruction utilized would be binary "000". Because the tester is in the HIGH IMPEDANCE state, this instruction will be interpreted as "go to DRIVE state". As soon as the tester leaves the HIGH IMPEDANCE state, the override will be cancelled and the driver will drive the pin low. The next instruction in Table 1 is for the channel of the tester to MEASURE FOR A HIGH IMPEDANCE condition. Before deciding on the proper instruction, we look to the next time that the tester will be driving. This occurs at the end of the illustrated test sequence and the tester is driving high this time. Accordingly, we choose for our next instruction binary "101" (instruction number 5) which states that the tester should go into the MEASURE FOR HIGH IMPEDANCE state and toggle the output. This places the output in a high condition the next time this channel of the tester enters the DRIVE state. The next instruction stops the measurement for the high impedance state and places the channel of the tester in the high impedance state. Looking at Table 2 at the MEASURE FOR HIGH IMPEDANCE state, we see that the first instruction, that is, binary "000" will place the tester in the HIGH IMPEDANCE state. The next phase of the test expects the UUT to be driving and a 1 is expected. Accordingly, we want to start measuring for a high provided by the output of the UUT on the pin for that channel. Since we are in the HIGH IMPEDANCE state, we look down the possible instructions and see that instruction number 6, binary "110" is "measure for a high and enter the MEASURE state". At the end of the period of time necessary to make this measurement, we again enter the HIGH IMPEDANCE state to accommodatee the uncertainty period. Since we are now in the MEASURE state, we look at the table of possible instructions and see that instruction number 5 places the channel again in the HIGH IMPEDANCE state. The next phase of the test is for that channel of the tester to measure for a high impedance output. Since we are in the HIGH IMPEDANCE state, we see that instruction number 7 places us in the MEASURE FOR THE HIGH IMPEDANCE output state. Finally, that channel of the tester must drive the UUT high which is accomplished by instruction number 2 of the MEASURE FOR HIGH IMPEDANCE state which is "go to the DRIVE state". Remembering above that we placed the driver in the high output state with instruction number 2 by toggling the output state, the output will automatically be a high as soon as we enter the DRIVE state.

While a particular embodiment of the present invention has been disclosed herein, certain changes and modifications will readily occur to those skilled in the art. All such changes and modifications can be made without departing from the invention as defined by the appended claims.

We claim:

1. A method for operating a multichannel tester for an electronic circuit in which each channel operates independent of all other channels and has a test pin for contacting a test point of a unit under test and a pin memory circuit for storing instructions which determine a state of operation of said test pin, the method comprising cycling said pin memory circuit to a next address only when a new test instruction is required to change a state of operation of that channel independent of a state of operation of all other channels.

2. The method of claim 1 wherein said state of operation includes:
   driving said pin with a predetermined signal; and
   receiving data from said test point.

3. The method of claim 2 further comprising generating a clock signal;
   cycling said memory circuit, when required, in synchronism with said clock signal.

4. The method of claim 3 further comprising generating a signal which starts a test sequence for all channels and stops said test sequence for all channels.

5. The method of claim 4 wherein said predetermined signal and said received data are digital signals.

6. A method for operating a multichannel tester for an electronic circuit in which each channel operates independent of all other channels having in each channel a test pin for contacting a test point of a unit under test a pin memory circuit storing test instructions which determine a state of operation of said test pin, and a channel control circuit coupled between said test pin and an output of said pin memory circuit, the method comprising:
   programming a timer in said channel control circuit utilizing instructions appearing at said output of said pin memory circuit to time a desired interval between a present state of operation of said test pin and a next state of operation of said pin;
   cycling said pin memory circuit to a next address to a new test instruction for said next state of operation of said test pin at the termination of said interval.

7. The method of claim 6 wherein said state of operation includes:
   driving said pin with a predetermined signal; and
   receiving data from said test point.

8. The method of claim 7 wherein said pin is driven by a pin driver circuit, and further comprising the step of placing said pin driver circuit in a high impedance state when said channel control circuit is instructed to receive data from said test point.

9. The method of claim 6 wherein said memory is cycled in synchronism with a clock signal which is common to all channels of said tester.

10. The method of claim 9 wherein a decoder and pin controller operate in synchronism with said clock signal.

11. The circuit of claim 10 wherein a start/stop signal starts a test sequence consisting of a sequence of test instructions in said pin memory in synchronism with a synch signal and stops said test sequence in synchronism with said synch signal in all channels of said tester.

12. A method for operating a multichannel tester for an electronic circuit in which each channel operates independent of all other channels and has a test pin for contacting a test point of a unit under test and a pin memory circuit for storing instructions which determine a state of operation of said test pin, the method comprising cycling said pin memory circuit to a next address when a new test instruction is required to change a state of operation of that channel independent of a state of operation of all other channels.

13. A method for controlling the operation of a component or board test system having a central processor, a clock generator, and a plurality of operating channels; each of said operating channels including a channel controller, memory, and pin electronics; comprising the steps of:
   loading the respective memories of said channel with respective independent, instruction sets corresponding to respective predetermined coordinated test sequences; and
   implementing said independent instruction sets synchronously, whereby each of said channels operates independently of other of said channels.

14. A method as in claim 13, wherein said implementing step comprises, with respect to each of said channels, the steps of:
   decoding an instruction sequence from at least one preselected address of the channel memory to obtain event and timing information;
   operating said pin electronics in accordance with said event and timing information; and
   repeating said decoding and operating steps until completion of the test.

15. A method as in claim 14, wherein said decoding step comprises the steps of:
   identifying a state change command to mark the start of said instruction sequence, wherein said event information is obtained from said state change command; and
   identifying a next consecutive state change command, wherein the end of said instruction sequence is the bit preceding said next consecutive state change command, and said timing information is at least in part determined as a function of the number of bits in said instruction sequence.

16. A method as in claim 15, wherein said state change command is context dependent.

17. A method as in claim 15, wherein said state change command is a predetermined number of bits in length and includes a flag bit in the lowest significant bit position thereof.

18. A method as in claim 15, wherein said timing information is determined also as a function of a holdoff commannd sequence occurring in said instruction sequence.

19. A method as in claim 18, wherein each holdoff command in said holdoff command sequence is a predetermined number of bits in length and includes a flag bit in the lowest significant bit position thereof.

* * * * *